United States Patent [19]

Suzuki

[11] Patent Number: 5,296,831
[45] Date of Patent: Mar. 22, 1994

[54] COIL ARRANGEMENT FOR A FOCUSING OR TRACK CONTROL CIRCUIT

[75] Inventor: Tsuneo Suzuki, Mönchweiler, Fed. Rep. of Germany

[73] Assignee: Deutsch Thomson Brandt GmbH, Villingen-Schwenningen, Fed. Rep. of Germany

[21] Appl. No.: 872,753

[22] Filed: Apr. 24, 1992

Related U.S. Application Data

[63] Continuation of PCT/EP90/01515, Sep. 7, 1990.

[30] Foreign Application Priority Data

Oct. 2, 1989 [DE] Fed. Rep. of Germany ....... 3932860

[51] Int. Cl.$^5$ .............................................. H01F 5/00
[52] U.S. Cl. ................................... 336/200; 336/232; 174/254; 439/77; 361/749
[58] Field of Search ................ 336/200, 232; 174/254, 174/268; 361/398, 409; 439/60, 67, 77

[56] References Cited

U.S. PATENT DOCUMENTS

| | | | |
|---|---|---|---|
| 3,736,543 | 5/1973 | Lademann et al. ................. | 336/200 |
| 4,748,293 | 5/1988 | Kikuchi et al. ..................... | 174/268 |
| 4,895,524 | 1/1990 | Thepault ......................... | 361/398 X |
| 4,906,803 | 3/1990 | Abrechta et al. ................. | 361/398 X |
| 4,974,121 | 11/1990 | Masuko ........................... | 361/398 X |
| 5,008,496 | 4/1991 | Schmidt et al. .................. | 361/398 X |
| 5,010,446 | 4/1991 | Scannell .......................... | 361/398 |

FOREIGN PATENT DOCUMENTS

0252651 1/1988 European Pat. Off. .

OTHER PUBLICATIONS

Patent Abstracts of Japan 59-40329.
Patent Abstracts of Japan 5-40330.
Patent Abstracts of Japan 59-40331.
Patent Abstracts of Japan 59-52079.
Patent Abstracts of Japan 59-52080.
Patent Abstracts of Japan 59-52081.

*Primary Examiner*—Leo P. Picard
*Assistant Examiner*—L. Thomas
*Attorney, Agent, or Firm*—J. S. Tripoli; E. P. Herrmann; L. L. Hallacher

[57] ABSTRACT

A coil arrangement for a control circuit which controls the motion of a housing includes coils arranged as a printed circuit on a flexible foil. The coils serve as the control elements for the control circuit. The foil is H-shaped and the coils are arranged on the verticals of H. The portions of the verticals in contact with the cross-bar of the H-shaped foil support connecting-conductors which connect the coils on the individual verticals. An aperture, soldering terminals and connecting conductors are arranged on the cross-bar of the H. The cross-bar is affixed to the top or bottom of a block-shaped housing and the verticals of the H are folded against the sides of the housing.

2 Claims, 2 Drawing Sheets

COIL ARRANGEMENT FOR A FOCUSING OR TRACK CONTROL CIRCUIT

This is a continuation of PCT application PCT/EP 90/01515 filed Sep. 7, 1990 by Tsuneo Suzuki and titled "Coil Arrangement For A Focusing Or Track Control Circuit".

This invention is directed to a coil arrangement for a focus or track control circuit in which coils are disposed on a flexible conductor foil as a printed circuit and utilized as control elements for the focus or track control circuit.

Coils having a diameter of about 4 mm and which are produced from a very thin wire having a diameter of about 0.08 to 0.01 mm serve as the regulating units in the servo circuits of a CD player. A CD player is equipped with two servo circuits, a focus control circuit and a track control circuit. The focus control circuit focuses a light beam onto a recording medium, i.e., a CD, by means of an object lens. The track control circuit causes the light beam to be precisely guided on the data tracks of the recording medium by means of the object lens.

The object lens can, for instance, be mounted in a block shaped housing. Focus coils for the focus control circuit are arranged at two opposing sides of the housing. The axes of the coils are parallel to the optical axis of the object lens. Two tracks coils for the track control circuit are arranged at the outer side of each focus coil. The axes of the track coils are perpendicular to the axes of the focus coils and are oriented in a radial direction relative to the CD. The legs of a U-shaped iron yoke, i.e. a horseshoe magnet, project into the interior spaces of the focus coils so that the track coils lie completely between the legs.

The housing with the object lens is affixed to a fixture such that it can be moved parallel to the optical axis and radially relative to the CD. Therefore, the object lens can be moved, by the focus coils, which regulate the focus control circuit, perpendicular to the recording medium to maintain focussing of the light beam on the recording medium.

The housing with the object lens can also be moved in a radial direction by the track coils which regulate the track control circuit, to cause the light beam to be guided along the data tracks of the disk-shaped recording medium. In order to limit the length of the track coils, two track coils are arranged on each focus coil next to each other.

While it is possible to wind the two track coils, which have a diameter of about 3 mm and a length of approximately 0.4 mm, using very thin wire, this technique is not preferred. However, when two separate track coils are used, their wire ends have to be soldered together. The coil wire has a diameter of only 0.08 to 0.01 mm and thus the soldering process is very difficult.

Patent EP-A 0 252 651 teaches that the coils of a track control circuit can be made of conductive strips on a flexible foil. Two foils with coils are placed one on top of the other. One of the coils serves for moving the object lens while the other coil is used to measure movement of the object lens.

Patent Abstracts of Japan JP-A-59 040329 shows an optical scanning device in which several coils are glued onto a flexible foil which is glued onto the shell of a cylinder.

Patent Abstracts of Japan JP-A-60 197940 discloses a conductor foil for an optical scanning device. A flexible conductor foil having the shape of an inverted T has the focus coil arranged on the vertical bar and one track coil arranged on each half of the horizontal crossbar. The foil is affixed to one side of a block shaped housing which supports the object lens. The protruding part of the vertical bar and the protruding parts of the cross bar are bent rectangularly so that they are in firm contact with the sides of the housing.

It is an object of the present invention to provide a coil arrangement for a focus and track control circuit, in which the coils are a printed circuit on a flexible conductive foil and which can be easily manufactured using standard techniques and in a cost effective manner.

With the invention, the conductive foil is H-shaped. The coils are printed on the verticals of the H, and soldering terminals and conductive strips are provided in the cross-bar of the H. The cross-bar is arranged on either the top or the bottom of a block shaped housing in which the object lens is housed and the verticals of the H are bent around the sides of the housing.

Figure 1:
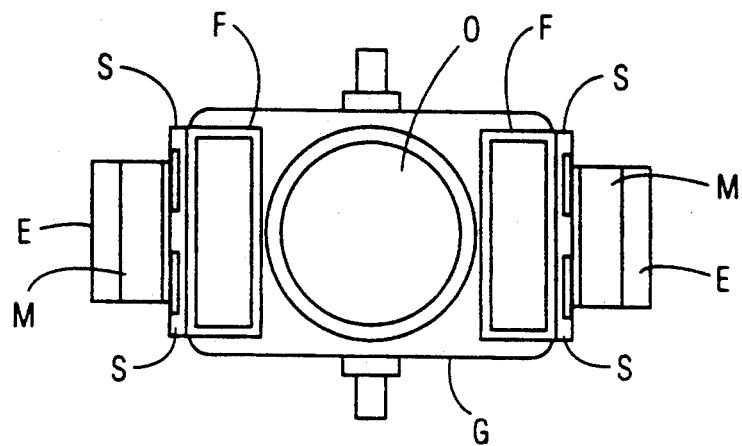
FIG. 1 is a top view of a housing having an object lens, two focus and four track coils and two U-shaped iron yokes for a CD player.
Figure 2:
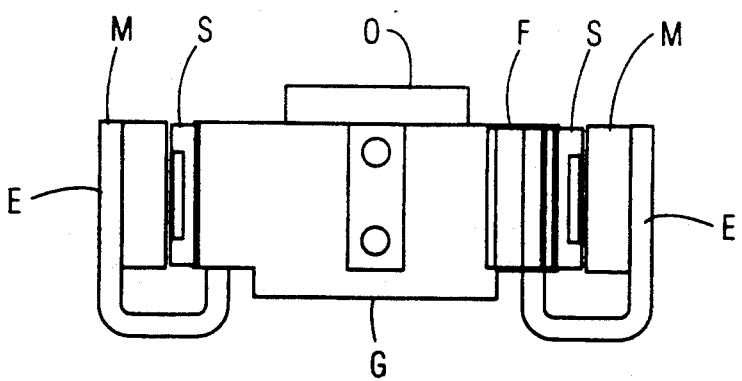
FIG. 2 is a side view of the housing of FIG. 1.

FIG. 1 shows a portion of an optical scanning device for a CD player. Focus coils F are arranged on two opposing sides of a housing G, in the center of which an object lens 0 is positioned. The axes of the focus coils F are parallel to the optical axis of the object lens 0. Track coils S are arranged at the outer side of each of the focus coils F. The axes of the track coils are perpendicular to the optical axis of the object lens 0. One leg of an iron yoke E projects into the interior space of the focus coils F so that the track coil S lies between the two legs of the iron yoke E. A magnet M may be arranged at one leg of each iron yoke E.

Figure 3:
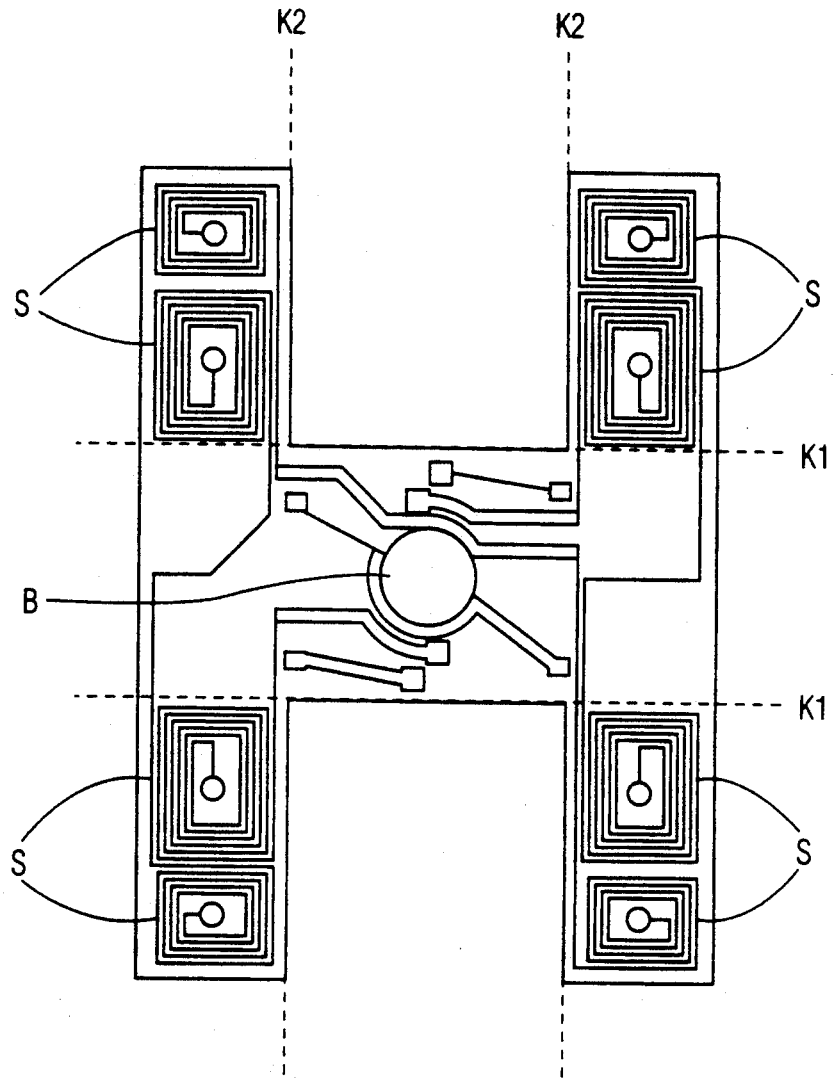
FIG. 3 is a preferred embodiment.

FIG. 3 shows an H-shaped conductive foil. Four focus coils S are arranged on the verticals of the H shaped foil. The portions of the verticals which are adjacent to the cross-bar support connecting-conductors which connect the coils on the respective verticals. Soldering terminals and conductive strips for making electrical connections are arranged in the cross-bar. An aperture B allows the light beam to pass through the foil and is provided in the middle of the cross-bar. The H-shaped foil, including the printed coils, is glued onto either the top or the bottom side of the housing G. The aperture B is aligned with the object lens and the light beam can pass through the foil H onto the recording medium.

The verticals of the H-shaped foil are initially folded along lines K2 and the center portions of the verticals where there are no coils lie against two opposing sides of the housing G. The verticals are then folded along the lines K1 and the other two sides of the housing G each are covered by the overlapping coils S so that except for the top and the aperture 13 the housing G is totally wrapped in foil. The verticals can be longer than shown in FIG. 3 and can include more coils in order to raise the field strength. If additional cells are used they are folded such that the fold lines lie between two coils. Each folding sheet then contains one coil. Obviously, insulation is used to maintain electrical isolation where needed.

The invention is suitable for several interconnected coils of small dimensions. In particular, it is suitable for the coils of the track control circuit of an optical scanning device, of the type used in CD players, video disc players, DRAW disc players or a magneto-optical recording and/or playback device.

We claim:

1. A coil arrangement for a control circuit which controls the motion of a housing, wherein the coils are arranged on a flexible foil as a printed circuit and serve as control elements for said control circuit, said coil arrangement comprising:

an H-shaped flexible foil, said coils being arranged on the verticals of said H-shaped foil, and the portions of said verticals adjacent to the cross-bar of said H-shaped foil supporting connecting-conductors which connect the coils on the individual vertical;

an aperture, soldering terminals and conductive strips arranged on said cross-bar, said cross-bar being affixed to the top or bottom of a block-shaped housing and the verticals of said H-shaped foil being folded against the sides of said housing.

2. The coil arrangement of claim 1 wherein each of said verticals supports a plurality of said coils and wherein said verticals are folded whereby two opposing sides of said housing support overlapping coils and the other two opposing sides of said housing support said connecting-conductors.

* * * * *